(12) United States Patent
Nam et al.

(10) Patent No.: US 12,464,727 B2
(45) Date of Patent: Nov. 4, 2025

(54) FERROELECTRIC MEMORY DEVICE

(71) Applicant: Samsung Electronics Co., Ltd., Suwon-si (KR)

(72) Inventors: Gabjin Nam, Seoul (KR); Bongjin Kuh, Suwon-si (KR); Musarrat Hasan, Sejong-si (KR); Geonju Park, Suwon-si (KR); Yongho Ha, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 468 days.

(21) Appl. No.: 18/049,366

(22) Filed: Oct. 25, 2022

(65) Prior Publication Data

US 2023/0165012 A1 May 25, 2023

(30) Foreign Application Priority Data

Nov. 25, 2021 (KR) .......................... 10-2021-0164865

(51) Int. Cl.
| | | |
|---|---|---|
| *H10B 51/30* | (2023.01) | |
| *H10B 51/20* | (2023.01) | |
| *H10D 30/60* | (2025.01) | |
| *H10D 30/69* | (2025.01) | |
| *H10D 64/68* | (2025.01) | |

(52) U.S. Cl.
CPC .............. *H10B 51/30* (2023.02); *H10B 51/20* (2023.02); *H10D 30/60* (2025.01); *H10D 30/701* (2025.01); *H10D 64/681* (2025.01); *H10D 64/689* (2025.01)

(58) Field of Classification Search
CPC ........ H10B 51/20; H10B 51/30; H10D 30/60; H10D 30/701; H10D 64/681; H10D 64/689
See application file for complete search history.

(56) References Cited

U.S. PATENT DOCUMENTS

| | | | |
|---|---|---|---|
| 6,420,742 | B1 | 7/2002 | Ahn et al. |
| 6,586,792 | B2 | 7/2003 | Ahn et al. |
| 7,985,995 | B2 | 7/2011 | Ahn et al. |
| 9,349,842 | B2 | 5/2016 | Schloesser et al. |
| 9,780,186 | B2 | 10/2017 | Sakai et al. |
| 10,192,972 | B2 | 1/2019 | Sakai et al. |
| 10,475,813 | B2 | 11/2019 | Yoo |

(Continued)

FOREIGN PATENT DOCUMENTS

| | | | | |
|---|---|---|---|---|
| CN | 110931467 A | | 3/2020 | |
| KR | 20190001455 A | * | 1/2019 | ........... H10D 64/689 |

(Continued)

OTHER PUBLICATIONS

First Office Action for TW Patent Application No. 111144637, mailed Aug. 9, 2023, 7 pages.

*Primary Examiner* — Matthew E Warren
(74) *Attorney, Agent, or Firm* — Wolf, Greenfield & Sacks, P.C.

(57) ABSTRACT

A ferroelectric memory device according to the inventive concept includes a substrate having source/drain regions, an interface layer on the substrate, a high dielectric layer on the interface layer, a ferroelectric layer on the high dielectric layer, and a gate electrode layer on the ferroelectric layer. The high dielectric layer and the ferroelectric layer have phases of different crystal structures.

20 Claims, 10 Drawing Sheets

(56) References Cited

U.S. PATENT DOCUMENTS

| | | | |
|---|---|---|---|
| 10,686,043 | B2 | 6/2020 | Sakai et al. |
| 10,854,709 | B2 | 12/2020 | Jung et al. |
| 10,998,408 | B2 | 5/2021 | Yamaguchi |
| 11,043,591 | B2 | 6/2021 | Gros-Jean et al. |
| 2019/0207009 | A1* | 7/2019 | Yamaguchi .......... H10D 30/701 |
| 2020/0279927 | A1 | 9/2020 | Sakai et al. |
| 2021/0043654 | A1 | 2/2021 | Yoo et al. |
| 2021/0313440 | A1* | 10/2021 | Peng ................ H10D 30/6211 |
| 2022/0013353 | A1* | 1/2022 | Lu ........................ H10D 64/689 |
| 2022/0285396 | A1* | 9/2022 | Huang .................. H10B 51/20 |
| 2022/0344488 | A1* | 10/2022 | Huang ................ H10D 64/689 |
| 2023/0143625 | A1* | 5/2023 | Huang ................ H10D 30/701 |
| | | | 257/295 |

FOREIGN PATENT DOCUMENTS

| | | | |
|---|---|---|---|
| TW | 200816314 A | 4/2008 | |
| TW | 200947672 A | 11/2009 | |
| TW | 202004915 A | 1/2020 | |
| TW | 202103308 A | 1/2021 | |
| WO | WO-2023024101 A1 * | 3/2023 | ............. G11C 11/22 |

\* cited by examiner

FERROELECTRIC MEMORY DEVICE

CROSS-REFERENCE TO RELATED APPLICATION

This application is based on and claims priority under 35 U.S.C. § 119 to Korean Patent Application No. 10-2021-0164865, filed on Nov. 25, 2021, in the Korean Intellectual Property Office, the disclosure of which is incorporated by reference herein in its entirety.

BACKGROUND

The inventive concept relates to a ferroelectric memory device, and more particularly, to a ferroelectric memory device having a spontaneous polarization characteristic.

Recently, along with the high processing speed and low power consumption of electronic products, a fast read/write operation and a low operating voltage have been desired for semiconductor devices embedded in electronic products. According to these requirements, research into a ferroelectric memory device having ferroelectricity to maintain spontaneous polarization by aligning internal electric dipole moments without applying an electric field from the outside has been conducted. In particular, a highly integrated ferroelectric memory device may perform a high-speed read operation and a high-speed write operation and has a non-volatile property, and thus, the highly integrated ferroelectric memory device has emerged as a next-generation memory device.

SUMMARY

The inventive concept provides a ferroelectric memory device having improved reliability by disposing a high dielectric layer between an interface layer and a ferroelectric layer to mitigate electric field concentration in the interface layer.

The inventive concept is not limited to the problems mentioned above, and other problems which are not mentioned could be clearly understood by those of ordinary skill in the art from the description below.

According to some embodiments of the inventive concept, there is provided a ferroelectric memory device including a substrate having source/drain regions, an interface layer on the substrate, a high dielectric layer on the interface layer, a ferroelectric layer on the high dielectric layer, and a gate electrode layer on the ferroelectric layer. The high dielectric layer and the ferroelectric layer have phases of different crystal structures.

According to some embodiments of the inventive concept, there is provided a ferroelectric memory device including a substrate having source/drain regions, a first interface layer on the substrate, a high dielectric layer on the first interface layer, a second interface layer on the high dielectric layer, a ferroelectric layer on the second interface layer, and a gate electrode layer on the ferroelectric layer. The high dielectric layer and the ferroelectric layer have phases of different crystal structures.

According to some embodiments of the inventive concept, there is provided a ferroelectric memory device including a gate stack on a substrate and including a plurality of gate electrode layers and a plurality of mold insulating layers alternately stacked in a vertical direction, a trench passing through the gate stack, a gate dielectric layer on side walls of the plurality of gate electrode layers inside the trench and including a ferroelectric part and a non-ferroelectric part, and a channel layer covering the gate dielectric layer. The gate dielectric layer includes an interface layer, a high dielectric layer on the interface layer, and a ferroelectric layer on the high dielectric layer, wherein the high dielectric layer and the ferroelectric layer have phases of different crystal structures.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept are described in detail with reference to the accompanying drawings.

Figure 1:
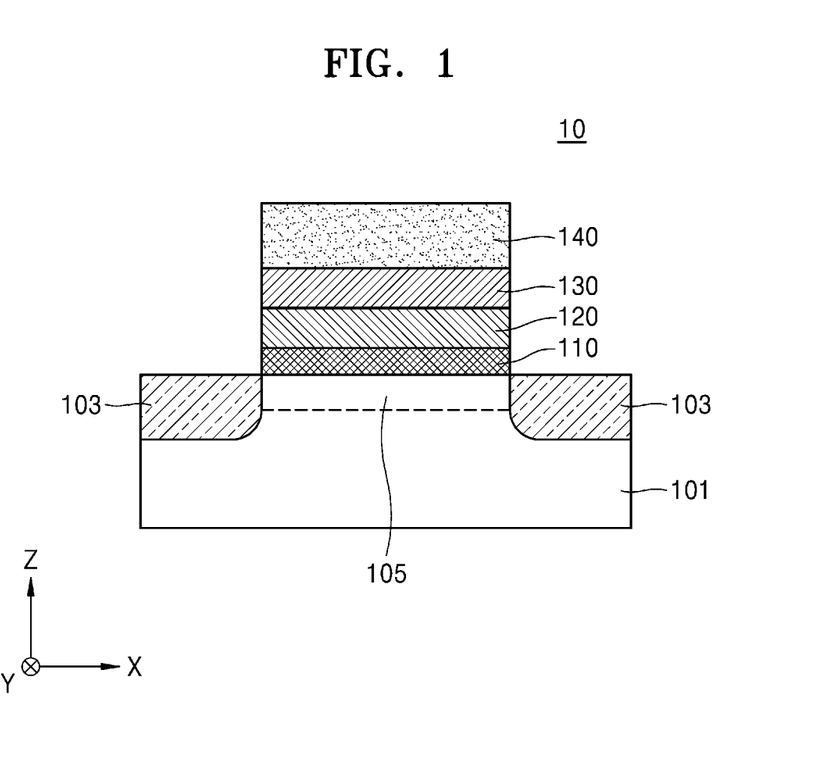
FIG. 1 is a cross-sectional view illustrating main components of a ferroelectric memory device according to some embodiments of the inventive concept.
Figure 2:
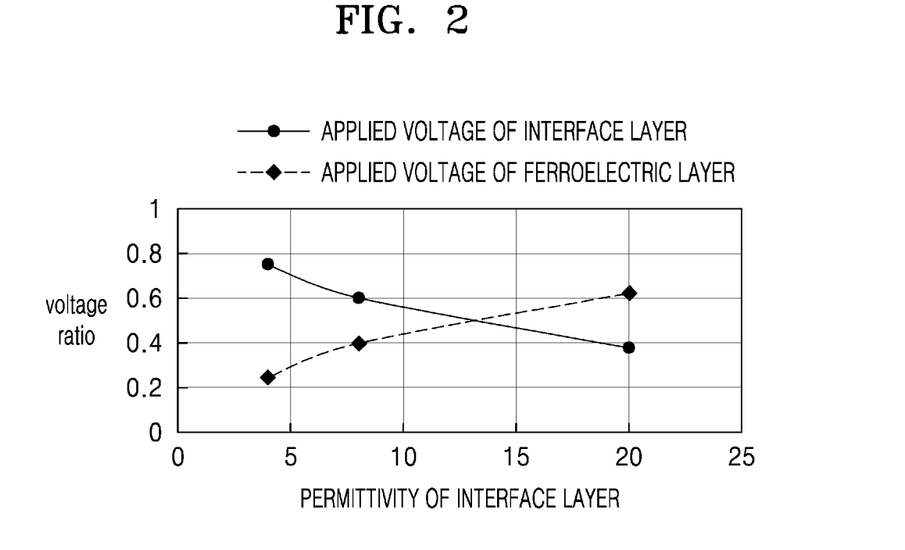
FIG. 2 is a graph illustrating a relationship between a permittivity and an applied voltage.

FIG. 1 is a cross-sectional view illustrating main components of a ferroelectric memory device 10 according to some embodiments of the inventive concept, and FIG. 2 is a graph illustrating a relationship between a permittivity and an applied voltage ratio.

Referring to FIGS. 1 and 2, the ferroelectric memory device 10 may include a substrate 101 having source/drain regions 103, an interface layer 110 on the substrate 101, a high dielectric layer 120 on the interface layer 110, a ferroelectric layer 130 on the high dielectric layer 120, and a gate electrode layer 140 on the ferroelectric layer 130.

Respective thicknesses of the substrate 101, the interface layer 110, the high dielectric layer 120, the ferroelectric layer 130, and the gate electrode layer 140 included in the ferroelectric memory device 10 are illustrative, and the inventive concept is not limited thereto.

The substrate 101 may include a semiconductor material, e.g., silicon (Si). In some embodiments, the substrate 101 may include a semiconductor element material, such as germanium (Ge), or a compound semiconductor material, such as silicon carbide (SiC), gallium arsenide (GaAs), indium arsenide (InAs), or indium phosphide (InP). In some embodiments, the substrate 101 may have a silicon on insulator (SOI) structure. The substrate 101 may include a conductive region, e.g., an impurity-doped well or an impurity-doped structure.

The source/drain regions 103 and a channel region 105 between the source/drain regions 103 may be included in the substrate 101. The substrate 101 may be doped with impurity ions to form the source/drain regions 103. Although FIG. 1 shows that the source/drain regions 103 are impurity regions formed inside the substrate 101, the source/drain regions 103 are not limited thereto. The source/drain regions 103 may include an epitaxial layer formed on or inside the substrate 101. The channel region 105 may be formed between the source/drain regions 103.

The interface layer 110 may include an amorphous low-k material layer. For example, the interface layer 110 may include a material selected between silicon oxide (SiO) and silicon oxynitride (SiON) but is not limited thereto. The interface layer 110 may be on the substrate 101. Particularly, the interface layer 110 may be in contact with the substrate 101 and on the channel region 105. In addition, the thickness of the interface layer 110 may be about 3 Å to about 20 Å but is not limited thereto.

The high dielectric layer 120 may include a high-k material having a higher dielectric constant than SiO. That is, a permittivity of the high dielectric layer 120 may be greater than a permittivity of the interface layer 110. For example, the high dielectric layer 120 may include a material selected from among hafnium oxide (HfO), doped HfO, zirconium oxide (ZrO), and/or hafnium silicon oxide (HfSiO, Si>10%), i.e. HfSiO with at least 10% silicon. A dopant of the doped HfO may be a material selected from among zirconium (Zr), lanthanum (La), yttrium (Y), gadolinium (Gd), Si, aluminum (Al), and/or a combination thereof. In addition, the high dielectric layer 120 may have a composite layer structure, e.g., a single thin-film structure, a stacked thin-film structure, or a laminate structure.

In the ferroelectric memory device 10 according to some embodiments of the inventive concept, the high dielectric layer 120 may have an M-phase of a monoclinic crystal structure or a T-phase of a tetragonal crystal structure. That is, the high dielectric layer 120 may include a non-ferroelectric, which does not exhibit a spontaneous polarization characteristic. As described below, the high dielectric layer 120 may be crystallized to an M-phase or a T-phase by rapid thermal annealing (RTA). Particularly, in an annealing process of the high dielectric layer 120, a process temperature of RTA may be about 400° C. to about 1200° C., and a process time at an RTA temperature may be about one second to about 200 seconds. In addition, the thickness of the high dielectric layer 120 may be about 3 Å to about 70 Å but is not limited thereto.

The ferroelectric layer 130 may include a high-k material having a higher dielectric constant than SiO. That is, a permittivity of the ferroelectric layer 130 may be greater than the permittivity of the interface layer 110. For example, the ferroelectric layer 130 may include a material selected from among HfO, doped HfO, hafnium zirconium oxide (HfZrO), and/or HfSiO (2%<Si<10%), i.e. HfSiO with 2%-10% silicon. A dopant of the doped HfO may be a material selected from among Zr, La, Y, Gd, Si, Al, and/or a combination thereof. In addition, the ferroelectric layer 130 may have a composite layer structure, e.g., a single thin-film structure, a stacked thin-film structure, or a laminate structure.

In the ferroelectric memory device 10 according to some embodiments of the inventive concept, the ferroelectric layer 130 may have an O-phase of an orthorhombic crystal structure. That is, the ferroelectric layer 130 may include a ferroelectric, which exhibits a spontaneous polarization characteristic of a dipole moment. As described below, the ferroelectric layer 130 may be crystallized to an O-phase by laser annealing. Particularly, in an annealing process of the ferroelectric layer 130, a process temperature of laser annealing may be about 500° C. to about 1200° C., and a process time at a peak temperature may be about 0.2 ms to about 20 ms. In addition, the thickness of the ferroelectric layer 130 may be about 3 Å to about 70 Å but is not limited thereto. Herein, the thickness of the ferroelectric layer 130 may be substantially the same as the thickness of the high dielectric layer 120.

The gate electrode layer 140 may include a material selected from among titanium nitride (TiN), tungsten (W), molybdenum (Mo), tantalum nitride (TaN), tantalum (Ta), titanium (Ti), Si, Silicon germanium (SiGe), and/or a combination thereof but is not limited thereto.

In some embodiments of the inventive concept, the ferroelectric memory device 10 including the ferroelectric layer 130 is disclosed. Recently, research for a technique of securing a ferroelectric property from a paraelectric material has been briskly conducted. For example, the presence of a material having a ferroelectric property may be identified by transforming a lattice structure from an amorphous structure into an orthorhombic crystal structure by an annealing process.

In the ferroelectric memory device 10 according to the inventive concept, according to a polarity of a voltage applied to the gate electrode layer 140, polarization having different polarities may be non-volatilely formed in the channel region 105 formed in the substrate 101 beneath the interface layer 110. By differentiating densities of carriers conducted through the channel region 105 according to the polarities of the polarization, electrical information may be non-volatilely stored in the ferroelectric memory device 10.

In general, the ferroelectric memory device 10 has vulnerable reliability in endurance. It may be analyzed that the reason why the endurance is vulnerable is because an applied voltage or a higher voltage than the applied voltage is applied to the interface layer 110 between the ferroelectric layer 130 and the substrate 101 in a switching process for a polarization characteristic of a ferroelectric. Therefore, an increase in a used frequency of a memory device may cause breakdown of the interface layer 110.

To solve this problem, increasing the permittivity of the interface layer 110 is the most practical method. That is, as shown in FIG. 2, the higher the permittivity of the interface layer 110, the lower an actual voltage applied to the interface layer 110. In the ferroelectric memory device 10 according to some embodiments of the inventive concept, the high dielectric layer 120 having a high permittivity may be on the interface layer 110 to disperse a voltage applied to the interface layer 110 to the high dielectric layer 120. Accordingly, the ferroelectric memory device 10 according to some embodiments of the inventive concept may have improved reliability in endurance and the like by mitigating electric field concentration in the interface layer 110.

Figure 3:
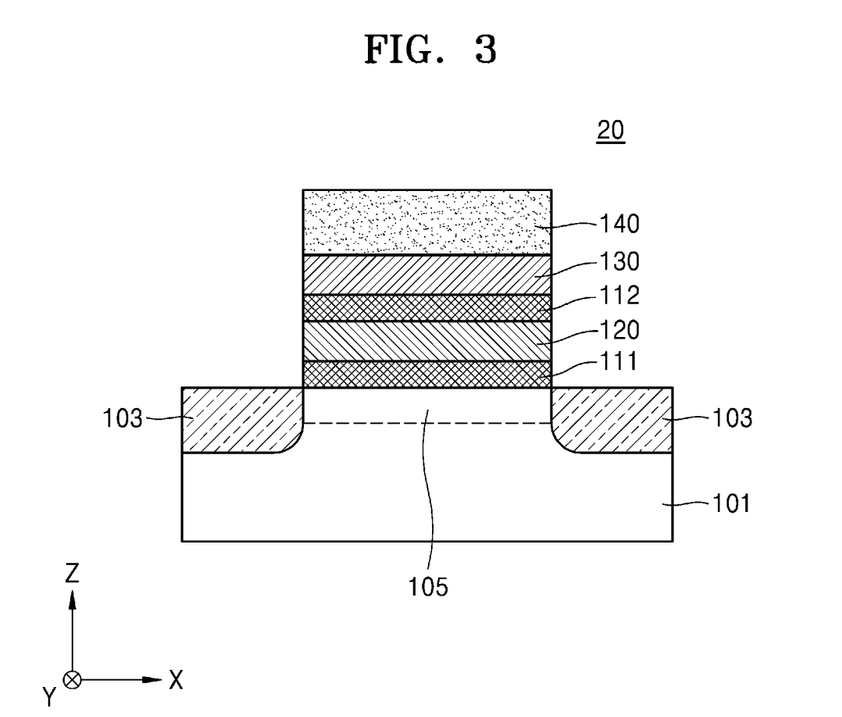
FIG. 3 is a cross-sectional view illustrating main components of a ferroelectric memory device according to some embodiments of the inventive concept.

FIG. 3 is a cross-sectional view illustrating main components of a ferroelectric memory device 20 according to some embodiments of the inventive concept.

Most components included in the ferroelectric memory device 20 and materials of the components to be described below are substantially the same as or similar to those described above with reference to FIGS. 1 and 2. Therefore, for convenience of description, differences from the ferroelectric memory device 10 described above are mainly described.

Referring to FIG. 3, the ferroelectric memory device 20 may include the substrate 101 having the source/drain regions 103, a first interface layer 111 on the substrate 101, the high dielectric layer 120 on the first interface layer 111, a second interface layer 112 on the high dielectric layer 120, the ferroelectric layer 130 on the second interface layer 112, and the gate electrode layer 140 on the ferroelectric layer 130.

Respective thicknesses of the substrate 101, the first interface layer 111, the high dielectric layer 120, the second interface layer 112, the ferroelectric layer 130, and the gate electrode layer 140 included in the ferroelectric memory device 20 are illustrative, and the inventive concept is not limited thereto.

Each of the first interface layer 111 and the second interface layer 112 may include an amorphous low-k material. For example, each of the first interface layer 111 and the second interface layer 112 may include a material selected between SiO and/or SiON but is not limited thereto. Herein, the first interface layer 111 and the second interface layer 112 may include substantially the same material.

The first interface layer 111 may be on the substrate 101. Particularly, the first interface layer 111 may be in contact with the substrate 101 and on the channel region 105. In addition, the thickness of the first interface layer 111 may be about 3 Å to about 20 Å but is not limited thereto.

The second interface layer 112 may be on the high dielectric layer 120. Particularly, the second interface layer 112 may be in contact with the high dielectric layer 120 and beneath the ferroelectric layer 130. In addition, the thickness of the second interface layer 112 may be about 3 Å to about 20 Å but is not limited thereto. Herein, the thickness of the first interface layer 111 may be substantially the same as the thickness of the second interface layer 112.

In the ferroelectric memory device 20 according to some embodiments of the inventive concept, the high dielectric layer 120 may have an M-phase of a monoclinic crystal structure or a T-phase of a tetragonal crystal structure, and the ferroelectric layer 130 may have an O-phase of an orthorhombic crystal structure. The second interface layer 112 may function to clearly discriminate between the high dielectric layer 120 and the ferroelectric layer 130 having different crystal structures and different ferroelectric characteristics.

Figure 4:
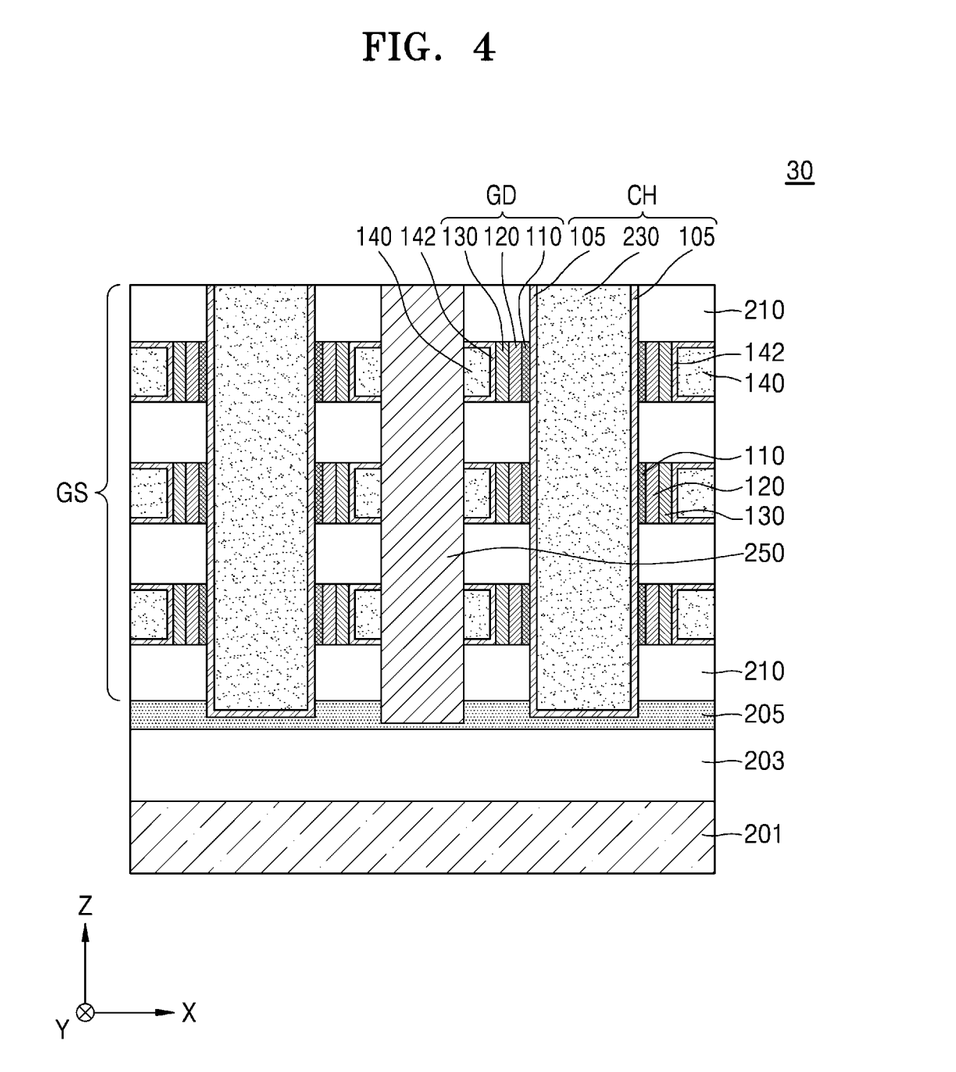
FIG. 4 is a cross-sectional view illustrating main components of a ferroelectric memory device according to some embodiments of the inventive concept.

FIG. 4 is a cross-sectional view illustrating main components of a ferroelectric memory device 30 according to some embodiments of the inventive concept.

Most components included in the ferroelectric memory device 30 and materials of the components to be described below are substantially the same as or similar to those described above with reference to FIGS. 1 and 2. Therefore, for convenience of description, differences from the ferroelectric memory device 10 described above are mainly described.

Referring to FIG. 4, the ferroelectric memory device 30 may include a gate stack GS including a plurality of gate electrode layers 140 and a plurality of mold insulating layers 210 alternately stacked in a vertical direction, a gate dielectric layer GD including a ferroelectric part and a non-ferroelectric part, and a channel layer CH covering or overlapping the gate dielectric layer GD in the X direction.

A substrate 201 may include a semiconductor material, e.g., Si. The substrate 201 may correspond to the substrate 101 (see FIG. 1) described above, and thus, a detailed description of the substrate 201 is omitted herein.

A base insulating layer 203 may be formed on the substrate 201. The base insulating layer 203 may include a material including at least one of, for example, SiO, silicon nitride, and/or SiON. The base insulating layer 203 may include a single layer including one type of insulating layer, a dual layer including two types of insulating layers, or a multi-layer including a combination of at least three types of insulating layers.

An etch stop layer 205 may be formed on the base insulating layer 203. An upper surface of the etch stop layer 205 may be uneven, and a lower surface of the etch stop layer 205 may be flat. The etch stop layer 205 may include, for example, silicon nitride or SiO.

The plurality of mold insulating layers 210 may be on the etch stop layer 205 at certain intervals therebetween in the vertical direction (Z direction). The plurality of mold insulating layers 210 may include at least one of SiO, silicon nitride, and/or SiON. In some embodiments, the plurality of mold insulating layers 210 and the etch stop layer 205 may include materials having etch selectivities for each other. For example, when the mold insulating layer 210 includes SiO, the etch stop layer 205 may include silicon nitride.

A buried insulating layer 250 may pass through the plurality of mold insulating layers 210. For example, the etch stop layer 205 may be on a lower surface of the buried insulating layer 250. In some embodiments, buried insulating layers 250 may be separated from each other in a first horizontal direction (X direction) and extend in a second horizontal direction (Y direction). The buried insulating layer 250 may include, for example, SiO, silicon nitride, or a combination thereof.

The channel layer CH may include the channel region 105 on an inner wall of a trench in the vertical direction (Z direction) and a channel buried layer 230 at least partially or completely filling the inside of the trench on the channel region 105.

Channel layers CH may be separated above the substrate 201 from each other in the first horizontal direction (X direction) and the second horizontal direction (Y direction) and extend in the vertical direction (Z direction). In some embodiments, unlike shown in FIG. 4, each of the channel layers CH may have a tapered shape in which widths of each of the channel layers CH in the first and second horizontal directions (X and Y directions) gradually decrease toward the substrate 201.

The channel region 105 may be on an inner wall of the channel buried layer 230 inside the vertical trench. Although FIG. 4 shows that the channel region 105 extends to conformally surround the channel buried layer 230, the channel region 105 is not limited thereto.

The gate dielectric layer GD may include a ferroelectric part and a non-ferroelectric part. Particularly, the gate dielectric layer GD may include the interface layer 110, the high dielectric layer 120, and the ferroelectric layer 130. The interface layer 110, the high dielectric layer 120, and the ferroelectric layer 130 may be arranged in their order inside each of side opening parts extending in the first horizontal direction (X direction) by passing through the plurality of mold insulating layers 210.

Particularly, interface layers 110 may be adjacent to one end of the channel region 105, extend in the second horizontal direction (Y direction), and be separated from each other in the vertical direction (Z direction). The high dielectric layer 120 may be adjacent to one end of the interface layer 110 and extend in the second horizontal direction (Y direction), and high dielectric layers 120 may be separated from each other in the vertical direction (Z direction). The ferroelectric layer 130 may be adjacent to one end of the high dielectric layer 120 and extend in the second horizontal direction (Y direction), and ferroelectric layers 130 may be separated from each other in the vertical direction (Z direction). That is, the mold insulating layer 210 may be between two interface layers 110, between two high dielectric layers 120, and between two ferroelectric layers 130 respectively adjacent in the vertical direction (Z direction).

Gate electrode layers 140 may face each other with the channel layer CH therebetween. The gate electrode layer 140 may be adjacent to one end of the ferroelectric layer 130 and extend in the second horizontal direction (Y direction), and gate electrode layers 140 may be separated from each other in the vertical direction (Z direction). The mold insulating layer 210 may be between two gate electrode layers 140 adjacent in the vertical direction (Z direction).

In some embodiments, gate barrier layers 142 may be respectively inside the side opening parts extending in the first horizontal direction (X direction) by passing through the plurality of mold insulating layers 210. The gate barrier layer 142 may be in contact with the mold insulating layer 210 and the gate electrode layer 140, and the inside of the gate barrier layer 142 may be at least partially or completely filled with the gate electrode layer 140.

In some embodiments, although not shown, a select transistor may be around a memory cell transistor.

The ferroelectric memory device 30 may operate in a similar manner to a tunneling field-effect transistor storing data in a memory cell by using a spontaneous polarization characteristic of the ferroelectric layer 130. That is, the ferroelectric memory device 30 may function as dynamic random access memory (DRAM) on which a read/write operation of stored one-bit data may be performed even without using a capacitor. In this manner, the ferroelectric memory device 30 that is capacitorless DRAM may be implemented.

In addition, a three-dimensional transistor including the gate stack GS, as shown in FIG. 4, has been described as the ferroelectric memory device 30 according to the inventive concept, but the ferroelectric memory device 30 is not limited thereto. For example, the ferroelectric memory device 30 according to the inventive concept may include various types of transistors, such as fin-type field-effect transistor (FinFET), a transistor including nanowires, and a transistor including nanosheets (i.e., a multi bridge channel FET)(MBCFET®).

Figure 5:
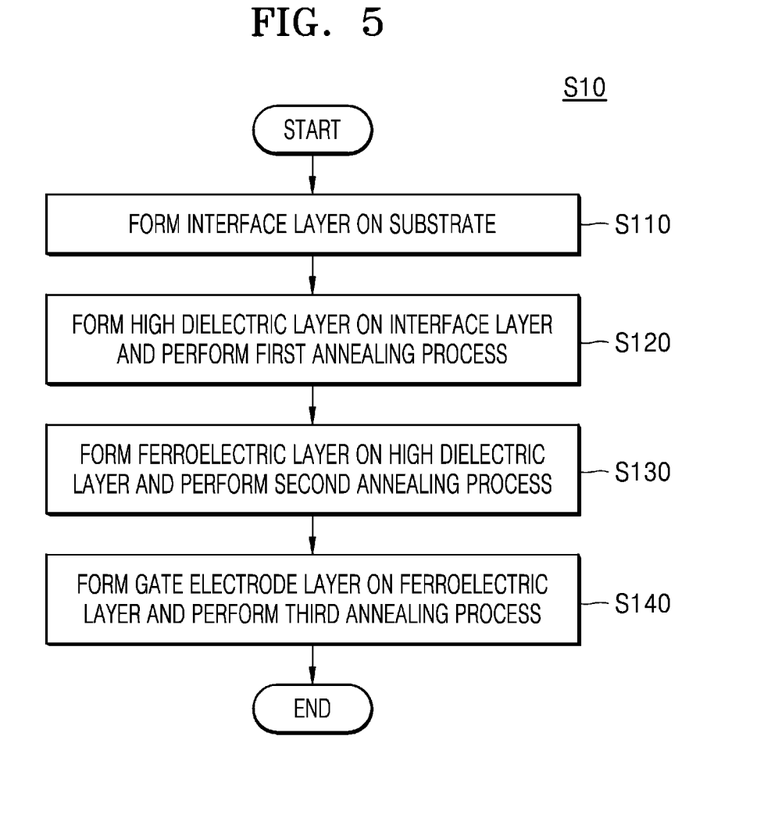
FIG. 5 is a flowchart illustrating a method of manufacturing a ferroelectric memory device, according to some embodiments of the inventive concept.

FIG. 5 is a flowchart illustrating a method S10 of manufacturing a ferroelectric memory device, according to some embodiments of the inventive concept.

Referring to FIG. 5, the method S10 of manufacturing a ferroelectric memory device may include a process order of first to fourth operations S110 to S140.

When a certain embodiment is differently implemented, a particular process order may be differently performed from the order to be described below. For example, two continuous processes may be performed substantially at the same time or performed in an opposite order.

The method S10 of manufacturing a ferroelectric memory device, according to the inventive concept, may include first operation S110 of forming an interface layer on a substrate, second operation S120 of forming a high-k material layer on the interface layer and performing a first annealing process, third operation S130 of forming a ferroelectric material layer on a high dielectric layer and performing a second annealing process, and fourth operation S140 of forming a gate electrode layer on a ferroelectric layer and performing a third annealing process.

A technical feature of each of first to fourth operations S110 to S140 is described below in detail with reference to FIGS. 6 to 9.

FIGS. 6 to 9 are cross-sectional views for describing, in a process order, a method of manufacturing a ferroelectric memory device, according to some embodiments of the inventive concept.

Figure 6:
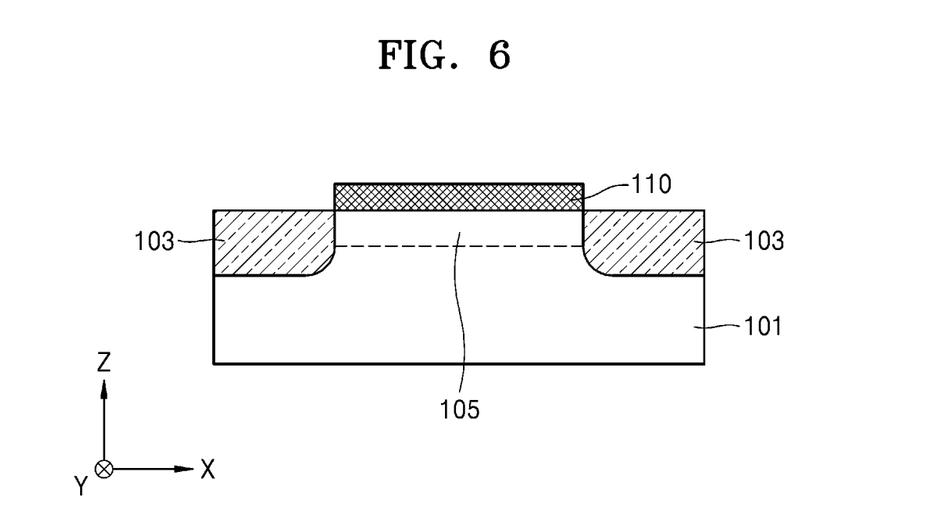
FIGS. 6 to 9 are cross-sectional views for describing, in a process order, a method of manufacturing a ferroelectric memory device, according to some embodiments of the inventive concept.

Referring to FIG. 6, the interface layer 110 may be formed on the substrate 101.

The substrate 101 may include a semiconductor material, e.g., Si. In some embodiments, the substrate 101 may have an SOI structure.

In some embodiments, the source/drain regions 103 and the channel region 105 between the source/drain regions 103 may be included in the substrate 101. The source/drain regions 103 may include an epitaxial layer formed on or inside the substrate 101. The channel region 105 may be formed between the source/drain regions 103.

In some embodiments, unlike shown in FIG. 6, the source/drain regions 103 and the channel region 105 may be formed in an impurity doping process after finally forming a gate structure.

The interface layer 110 may include an amorphous low-k material layer. For example, the interface layer 110 may include a material selected between SiO and/or SiON. The interface layer 110 may be in contact with the substrate 101 and on the channel region 105.

Figure 7:
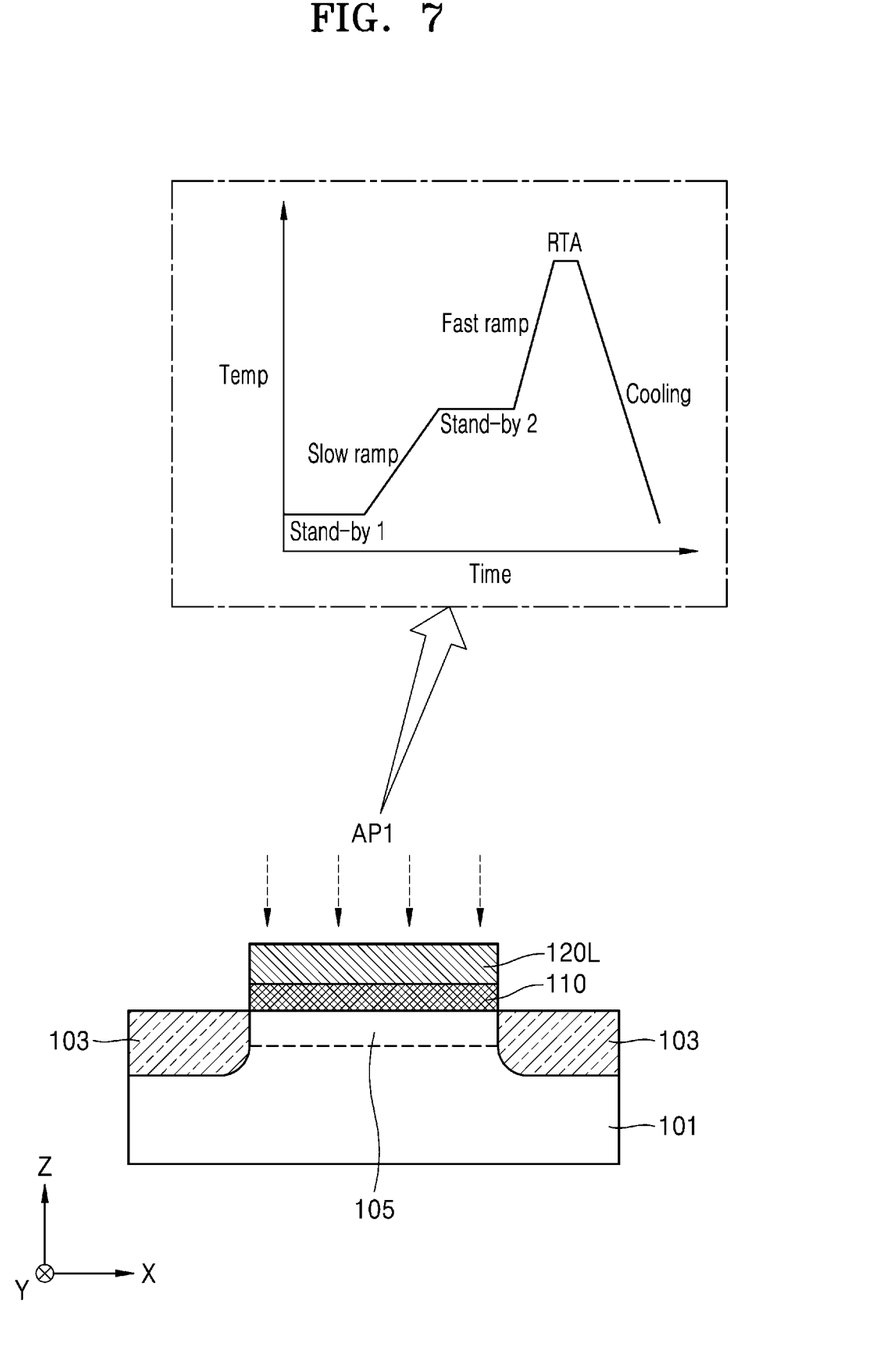

Referring to FIG. 7, a high-k material layer 120L may be formed on the interface layer 110, and a first annealing process AP1 may be performed.

The high-k material layer 120L may include a high-k material having a higher dielectric constant than SiO. For example, the high-k material layer 120L may include a material selected from among HfO, doped HfO, ZrO, and/or HfSiO (Si>10%). A dopant of the doped HfO may be a material selected from among Zr, La, Y, Gd, Si, Al, and/or a combination thereof.

The first annealing process AP1 may be performed on the high-k material layer 120L. The first annealing process AP1 may be an RTA process. For example, the RTA process may include a standby operation, a slow ramp operation, a fast ramp operation, an RTA operation, and a cooling operation. A process temperature in the first annealing process AP1 may be about 400° C. to about 1200° C., and a process time in the RTA operation may be about one second to about 200 seconds.

As described above, by performing the first annealing process AP1 with RTA in which annealing is performed at a high temperature for a relatively long time, the high-k material layer 120L may be crystallized to an M-phase of a monoclinic crystal structure or a T-phase of a tetragonal crystal structure. That is, the high-k material layer 120L may be crystallized to a high dielectric layer 120 (see FIG. 8) including a non-ferroelectric, which does not exhibit a spontaneous polarization characteristic.

Figure 8:
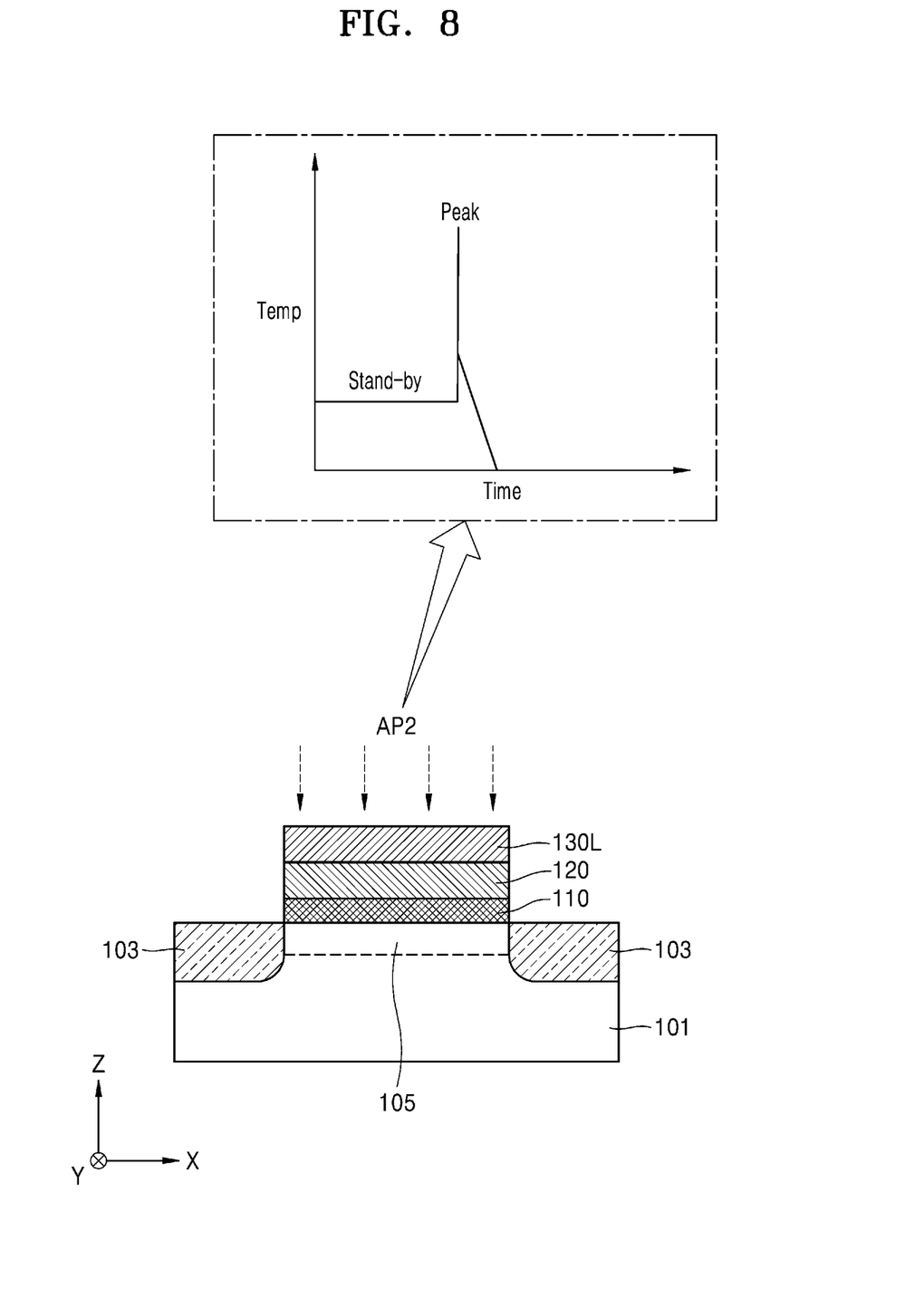

Referring to FIG. 8, a ferroelectric material layer 130L may be formed on the high dielectric layer 120, and a second annealing process AP2 may be performed.

The ferroelectric material layer 130L may include a high-k material having a higher dielectric constant than SiO. For example, the ferroelectric material layer 130L may include a material selected from among HfO, doped HfO, HfZrO, and/or HfSiO (2%<Si<10%). A dopant of the doped HfO may be a material selected from among Zr, La, Y, Gd, Si, Al, and/or a combination thereof.

The second annealing process AP2 may be performed on the ferroelectric material layer 130L. The second annealing process AP2 may be a laser annealing process. For example, the laser annealing process may include a standby operation and a peak operation. A process temperature in the second annealing process AP2 may be about 500° C. to about 1200° C., and a process time in the peak operation may be about 0.2 ms to about 20 ms.

As described above, by performing the second annealing process AP2 with laser annealing in which annealing is performed at a high temperature for a relatively short time, the ferroelectric material layer 130L may be crystallized to an O-phase of an orthorhombic crystal structure. That is, the ferroelectric material layer 130L may be crystallized to a ferroelectric layer 130 (see FIG. 9) including a ferroelectric, which exhibits a spontaneous polarization characteristic.

Figure 9:
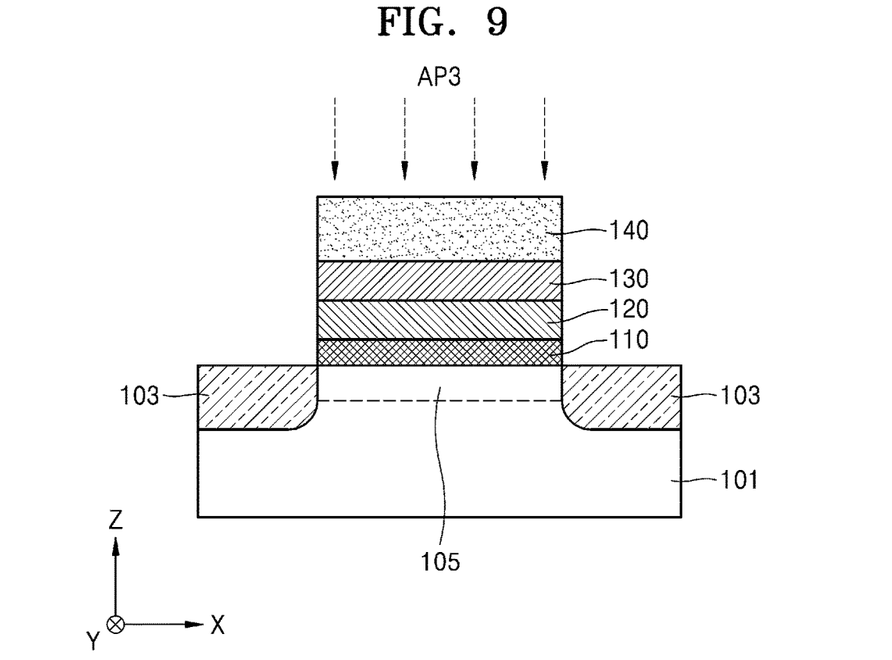

Referring to FIG. 9, the gate electrode layer 140 may be formed on the ferroelectric layer 130, and a third annealing process AP3 may be performed.

The gate electrode layer 140 may include a material selected from among TiN, W, Mo, TaN, Ta, Ti, Si, SiGe, and/or a combination thereof but is not limited thereto.

The third annealing process AP3 may be performed on the gate electrode layer 140. The third annealing process AP3 may be an RTA process or a laser annealing process.

In the method S10 (see FIG. 5) of manufacturing a ferroelectric memory device, according to the inventive concept, at least one process selected between the second annealing process AP2 (see FIG. 8) and the third annealing process AP3 may be performed. That is, a first case in which both the second annealing process AP2 (see FIG. 8) and the third annealing process AP3 are performed, a second case in which the second annealing process AP2 (see FIG. 8) is performed while the third annealing process AP3 is not performed, and a third case in which the second annealing process AP2 (see FIG. 8) is not performed while the third annealing process AP3 is performed may be considered. In all of the first to third cases, inventors may be aware through experiments that each of the high dielectric layer 120 and the ferroelectric layer 130 is crystallized to a phase of a desired crystal structure.

Figure 10:
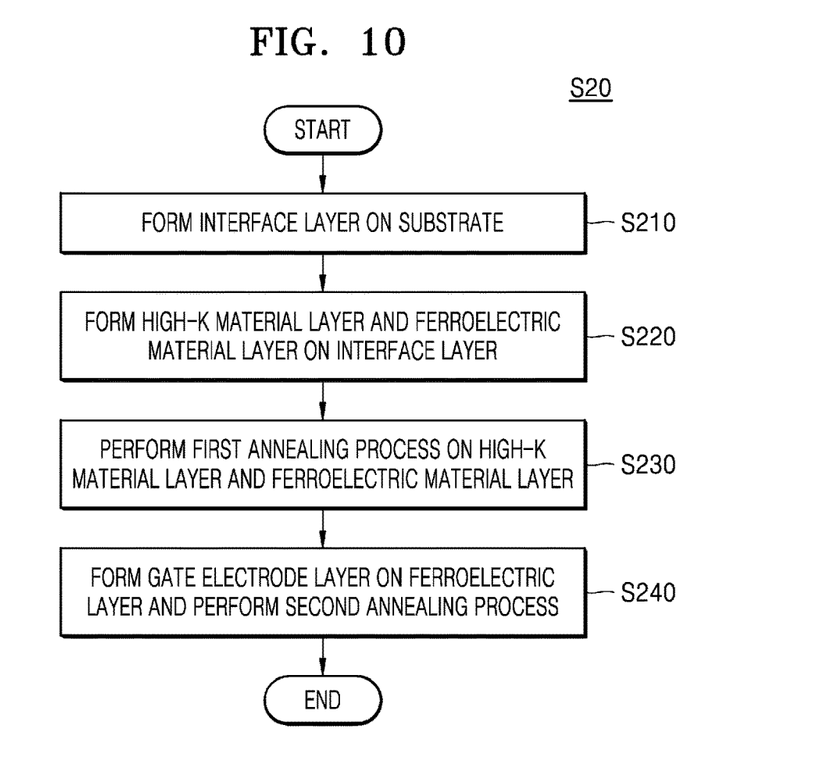
FIG. 10 is a flowchart illustrating a method of manufacturing a ferroelectric memory device, according to some embodiments of the inventive concept.

FIG. 10 is a flowchart illustrating a method S20 of manufacturing a ferroelectric memory device, according to some embodiments of the inventive concept.

Referring to FIG. 10, the method S20 of manufacturing a ferroelectric memory device may include a process order of first to fourth operations S210 to S240.

When a certain embodiment is differently implemented, a particular process order may be differently performed from the order to be described below. For example, two continuous processes may be performed substantially at the same time or performed in an opposite order.

The method S20 of manufacturing a ferroelectric memory device, according to the inventive concept, may include first operation S210 of forming an interface layer on a substrate, second operation S220 of forming a high-k material layer and a ferroelectric material layer on the interface layer, third operation S230 of performing a first annealing process on the high-k material layer and the ferroelectric material layer, and fourth operation S240 of forming a gate electrode layer on a ferroelectric layer and performing a second annealing process.

A technical feature of each of first to fourth operations S210 to S240 is described below in detail with reference to FIGS. 11 to 14.

FIGS. 11 to 14 are cross-sectional views for describing, in a process order, a method of manufacturing a ferroelectric memory device, according to some embodiments of the inventive concept.

Figure 11:
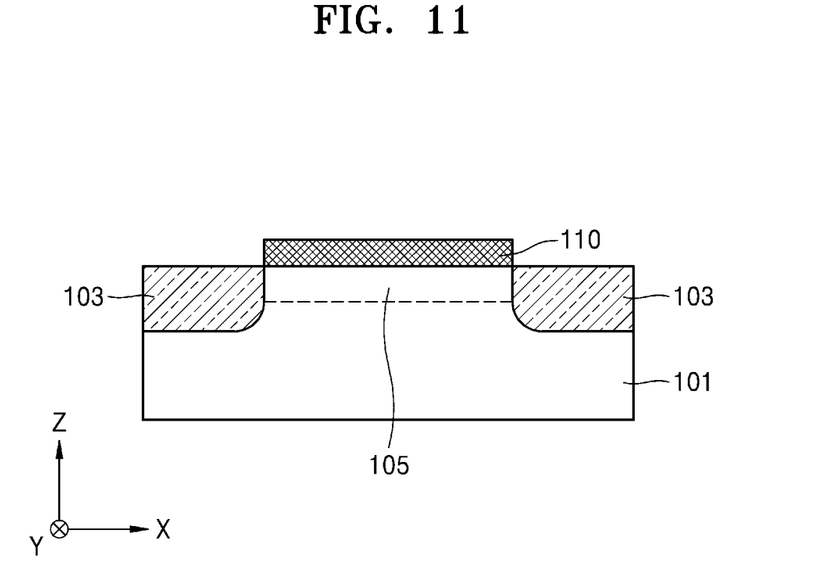
FIGS. 11 to 14 are cross-sectional views for describing, in a process order, a method of manufacturing a ferroelectric memory device, according to some embodiments of the inventive concept.

Referring to FIG. 11, the interface layer 110 may be formed on the substrate 101.

The substrate 101 may include a semiconductor material, e.g., Si. In some embodiments, the substrate 101 may have an SOI structure.

In some embodiments, the source/drain regions 103 and the channel region 105 between the source/drain regions 103 may be included in the substrate 101. The source/drain regions 103 may include an epitaxial layer formed on or inside the substrate 101. The channel region 105 may be formed between the source/drain regions 103.

In other embodiments, unlike shown in FIG. 11, the source/drain regions 103 and the channel region 105 may be formed in an impurity doping process after finally forming a gate structure.

The interface layer 110 may include an amorphous low-k material layer. For example, the interface layer 110 may include a material selected between SiO and/or SiON. The interface layer 110 may be in contact with the substrate 101 and on the channel region 105.

Figure 12:
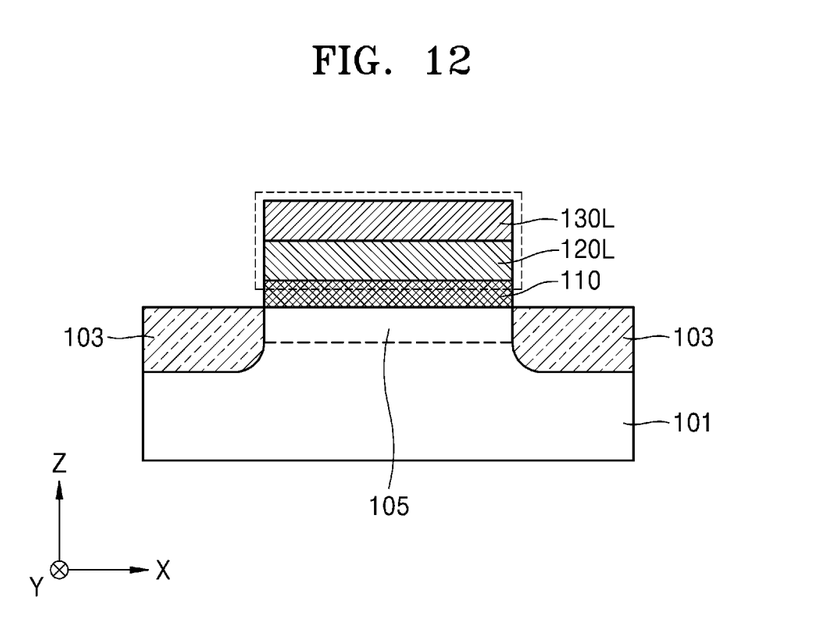

Referring to FIG. 12, the high-k material layer 120L and the ferroelectric material layer 130L may be formed on the interface layer 110.

The high-k material layer 120L may include a high-k material having a higher dielectric constant than SiO. For example, the high-k material layer 120L may include a material selected from among HfO, doped HfO, ZrO, and/or HfSiO (Si>10%).

The ferroelectric material layer 130L may include a high-k material having a higher dielectric constant than SiO. For example, the ferroelectric material layer 130L may include a material selected from among HfO, doped HfO, HfZrO, and/or HfSiO (2%<Si<10%).

A dopant of the doped HfO may be a material selected from among Zr, La, Y, Gd, Si, Al, and/or a combination thereof. Herein, the ferroelectric material layer 130L may include a different material from a material of the high dielectric layer 120.

The high-k material layer 120L and the ferroelectric material layer 130L may be formed by an in-situ scheme in the same process facility. The process facility may perform atomic layer deposition (ALD) but is not limited thereto.

Figure 13:
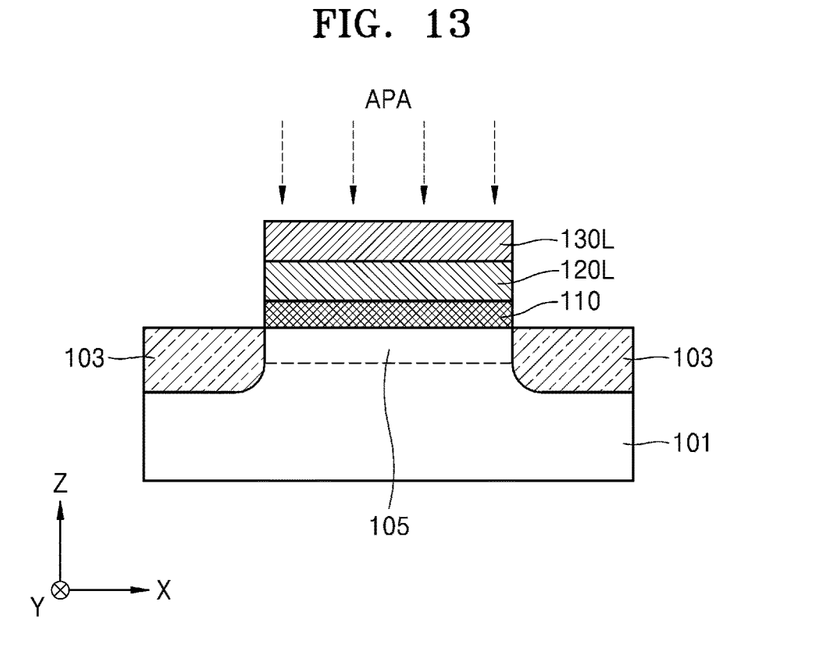

Referring to FIG. 13, a first annealing process APA may be performed on the high-k material layer 120L and the ferroelectric material layer 130L.

The first annealing process APA may be performed on both the high-k material layer 120L and the ferroelectric material layer 130L. The first annealing process APA may be a laser annealing process. For example, the laser annealing process may include a standby operation and a peak operation. A process temperature in the first annealing process APA may be about 500° C. to about 1200° C., and a process time in the peak operation may be about 0.2 ms to about 20 ms.

As described above, by performing the first annealing process APA on different materials with laser annealing in which annealing is performed at a high temperature for a relatively short time, the high-k material layer 120L may be crystallized to an M-phase of a monoclinic crystal structure or a T-phase of a tetragonal crystal structure, and the ferroelectric material layer 130L may be crystallized to an O-phase of an orthorhombic crystal structure. That is, the high-k material layer 120L may be crystallized to a high dielectric layer 120 (see FIG. 14) including a non-ferroelectric, which does not exhibit a spontaneous polarization characteristic, and the ferroelectric material layer 130L may be crystallized to a ferroelectric layer 130 (see FIG. 14) including a ferroelectric, which exhibits the spontaneous polarization characteristic.

Figure 14:
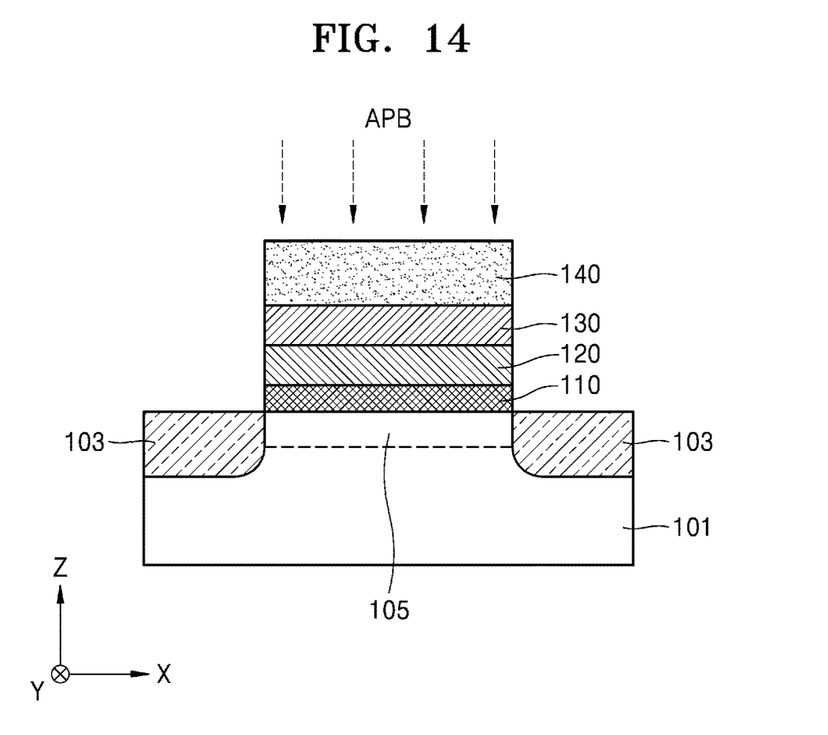

Referring to FIG. 14, the gate electrode layer 140 may be formed on the ferroelectric layer 130, and a second annealing process APB may be performed.

The gate electrode layer 140 may include a material selected from among TiN, W, Mo, TaN, Ta, Ti, Si, SiGe, and/or a combination thereof but is not limited thereto.

The second annealing process APB may be performed on the gate electrode layer 140. The second annealing process APB may be an RTA process or a laser annealing process.

In the method S20 (see FIG. 10) of manufacturing a ferroelectric memory device, according to the inventive concept, at least one process selected between the first annealing process APA (see FIG. 13) and the second annealing process APB may be performed.

That is, a fourth case in which both the first annealing process APA (see FIG. 13) and the second annealing process APB are performed, a fifth case in which the first annealing process APA (see FIG. 13) is performed while the second annealing process APB is not performed, and a sixth case in which the first annealing process APA (see FIG. 13) is not performed while the second annealing process APB is performed may be considered. In all of the fourth to sixth cases, inventors may be aware through experiments that each of the high dielectric layer 120 and the ferroelectric layer 130 is crystallized to a phase of a desired crystal structure.

Figure 15:
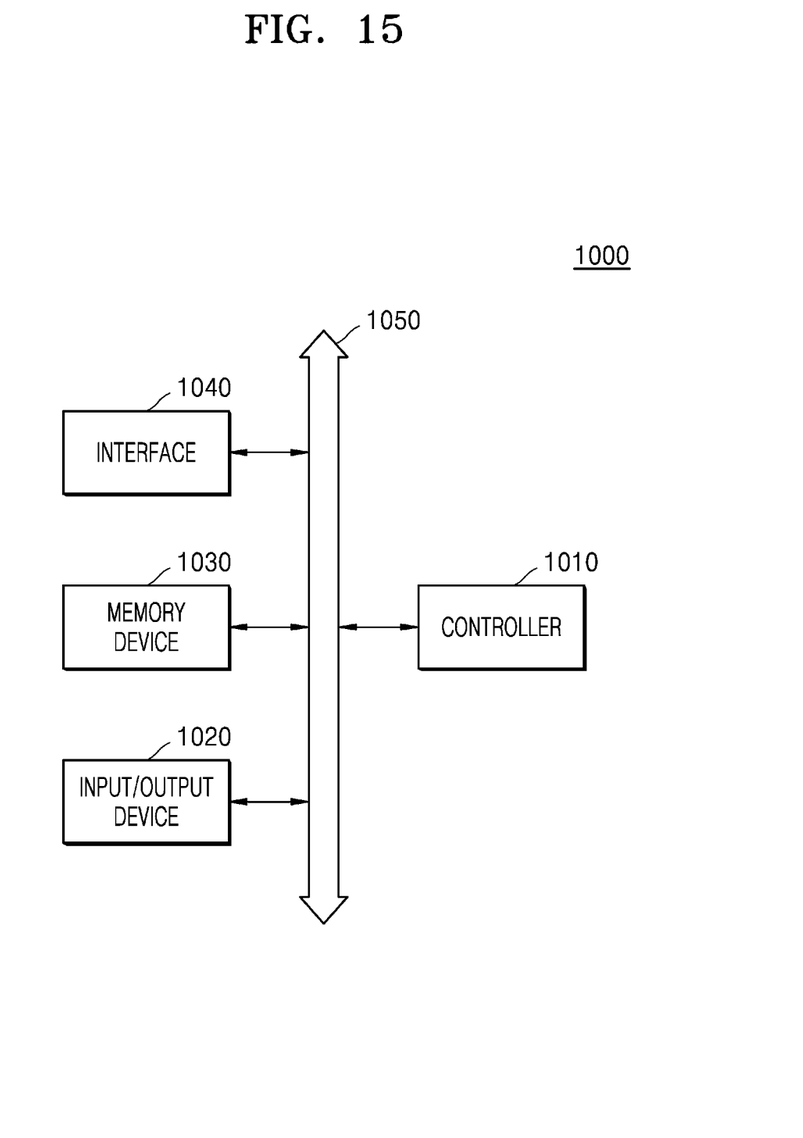
FIG. 15 is a block diagram illustrating a system including a ferroelectric memory device, according to some embodiments of the inventive concept.

FIG. 15 is a block diagram illustrating a system 1000 including a ferroelectric memory device, according to some embodiments of the inventive concept.

Referring to FIG. 15, the system 1000 may include a controller 1010, an input/output device 1020, a memory device 1030, an interface 1040, and a bus 1050.

The system 1000 may be a mobile system or a system configured to transmit or receive information. In some embodiments, the mobile system may be a portable computer, a web tablet, a mobile phone, a digital music player, or a memory card.

The controller 1010 is to control an execution program in the system 1000 and may include a microprocessor, a digital signal processor, a microcontroller, or a similar device.

The input/output device 1020 may be used to input or output data to or from the system 1000. The system 1000 may be connected to an external device, e.g., a personal computer or a network, and exchange data with the external device by using the input/output device 1020. The input/output device 1020 may include, for example, a touch screen, a touch pad, a keyboard, or a display.

The memory device 1030 may store data for an operation of the controller 1010 or data processed by the controller 1010. The memory device 1030 may include any one of the ferroelectric memory devices 10, 20, and/or 30 according to the inventive concept, which have been described above.

The interface 1040 may be a data transport passageway between the system 1000 and an external device. The controller 1010, the input/output device 1020, the memory device 1030, and the interface 1040 may communicate with each other via the bus 1050.

While the inventive concept has been particularly shown and described with reference to embodiments thereof, it will be understood that various changes in form and details may be made therein without departing from the spirit and scope of the following claims.

What is claimed is:

1. A ferroelectric memory device comprising:
a channel layer on a substrate;
a mold insulating layer on the substrate;
an interface layer on the channel layer;
a high dielectric layer on the interface layer;
a ferroelectric layer on the high dielectric layer; and
a gate electrode layer on the ferroelectric layer,
a gate barrier layer between the gate electrode layer and the ferroelectric layer,
wherein the gate barrier layer is in contact with the mold insulating layer and the gate electrode layer, and
wherein the high dielectric layer and the ferroelectric layer comprise phases of different crystal structures.

2. The ferroelectric memory device of claim 1,
wherein the high dielectric layer comprises an M-phase of a monoclinic crystal structure or a T-phase of a tetragonal crystal structure, and
wherein the ferroelectric layer comprises an O-phase of an orthorhombic crystal structure.

3. The ferroelectric memory device of claim 2,
wherein the high dielectric layer is crystallized to the M-phase or the T-phase by rapid thermal annealing (RTA), and
wherein the ferroelectric layer is crystallized to the O-phase by laser annealing.

4. The ferroelectric memory device of claim 3,
wherein a process temperature of the RTA is about 400° C. to about 1200° C., and a process time at a peak temperature is about one second to about 200 seconds, and
wherein a process temperature of the laser annealing is about 500° C. to about 1200° C., and a process time at a peak temperature is about 0.2 ms to about 20 ms.

5. The ferroelectric memory device of claim 3, wherein the high dielectric layer comprises a non-ferroelectric material layer which does not exhibit a polarization characteristic.

6. The ferroelectric memory device of claim 3,
wherein the interface layer comprises an amorphous low-k material layer, and
wherein the ferroelectric layer comprises a crystalline high-k material layer.

7. The ferroelectric memory device of claim 1,
wherein the high dielectric layer comprises hafnium oxide (HfO), doped HfO, zirconium oxide (ZrO), or hafnium silicon oxide (HfSiO, Si>10%),
wherein the ferroelectric layer comprises HfO, doped HfO, hafnium zirconium oxide (HfZrO), or HfSiO (2% <Si<10%), and
wherein a dopant of the doped HfO is zirconium (Zr), lanthanum (La), yttrium (Y), gadolinium (Gd), silicon (Si), aluminum (Al), or a combination thereof.

8. The ferroelectric memory device of claim 1,
wherein a thickness of each of the high dielectric layer and the ferroelectric layer is about 3 Å to about 70Å,
wherein a thickness of the interface layer is about 3 Å to about 20 Å, and
wherein the interface layer comprises silicon oxide (SiO) or silicon oxynitride (SiON).

9. The ferroelectric memory device of claim 1,
wherein the ferroelectric layer comprises a high-k material layer having a higher dielectric constant than SiO.

10. The ferroelectric memory device of claim 1, wherein the gate electrode layer comprises titanium nitride (TiN), tungsten (W), molybdenum (Mo), tantalum nitride (TaN), tantalum (Ta), titanium (Ti), silicon (Si), Silicon germanium (SiGe), or a combination thereof.

11. A ferroelectric memory device comprising:
a channel layer on a substrate;
a mold insulating layer on the substrate;
a first interface layer on the channel layer;
a high dielectric layer on the first interface layer;
a second interface layer on the high dielectric layer;
a ferroelectric layer on the second interface layer; and
a gate electrode layer on the ferroelectric layer,
a gate barrier layer that extends in a direction perpendicular to the substrate between the gate electrode layer and the ferroelectric layer,
wherein the gate barrier layer extends in a direction parallel to the substrate between the mold insulating layer and the gate electrode layer, and
wherein the high dielectric layer and the ferroelectric layer comprise phases of different crystal structures.

12. The ferroelectric memory device of claim 11,
wherein the high dielectric layer comprises an M-phase of a monoclinic crystal structure or a T-phase of a tetragonal crystal structure, and
wherein the ferroelectric layer comprises an O-phase of an orthorhombic crystal structure.

13. The ferroelectric memory device of claim 12,
wherein each of the first interface layer and the second interface layer comprises an amorphous low-k material layer, and
wherein the ferroelectric layer comprises a crystalline high-k material layer.

14. The ferroelectric memory device of claim 12,
wherein each of the first interface layer and the second interface layer comprises silicon oxide (SiO) or silicon oxynitride (SiON),
wherein the high dielectric layer comprises hafnium oxide (HfO), doped HfO, zirconium oxide (ZrO), or hafnium silicon oxide (HfSiO, Si>10%),
wherein the ferroelectric layer comprises HfO, doped HfO, hafnium zirconium oxide (HfZrO), or HfSiO (2% <Si<10%),
wherein the gate electrode layer comprises titanium nitride (TiN), tungsten (W), molybdenum (Mo), tantalum nitride (TaN), tantalum (Ta), titanium (Ti), silicon (Si), Silicon germanium (SiGe), or a combination thereof, and
wherein a dopant of the doped HfO comprises zirconium (Zr), lanthanum (La), yttrium (Y), gadolinium (Gd), silicon (Si), aluminum (Al), or a combination thereof.

15. The ferroelectric memory device of claim 11,
wherein a thickness of each of the first interface layer and the second interface layer is about 3 Å to about 20 Å, and
wherein a thickness of each of the high dielectric layer and the ferroelectric layer is about 3 Å to about 70Å.

16. A ferroelectric memory device comprising:
a gate stack on a substrate and comprising a plurality of gate electrode layers and a plurality of mold insulating layers alternately stacked in a vertical direction perpendicular to the substrate;
a trench passing through the gate stack;
a gate dielectric layer on side walls of the plurality of gate electrode layers inside the trench, and comprising a ferroelectric part and a non-ferroelectric part; and
a channel layer on the gate dielectric layer,
wherein the gate dielectric layer comprises:
an interface layer;
a high dielectric layer on the interface layer; and
a ferroelectric layer on the high dielectric layer; and
a gate barrier layer in contact with at least one of the plurality of mold insulating layers and a respective one of the plurality of gate electrode layers,
wherein a first portion of the gate barrier layer is on a side surface of the gate electrode layer and on a side surface of the ferroelectric layer,
wherein a second portion of the gate barrier layer is on top and bottom surfaces of the gate electrode layer, and
wherein the high dielectric layer and the ferroelectric layer comprise phases of different crystal structures.

17. The ferroelectric memory device of claim 16,
wherein the interface layer comprises an amorphous low-k material layer,
wherein the high dielectric layer comprises an M-phase of a monoclinic crystal structure or a T-phase of a tetragonal crystal structure, and
wherein the ferroelectric layer comprises an O-phase of an orthorhombic crystal structure.

18. The ferroelectric memory device of claim 17,
wherein the interface layer comprises silicon oxide (SiO) or silicon oxynitride (SiON),
wherein the high dielectric layer comprises hafnium oxide (HfO), doped HfO, zirconium oxide (ZrO), or hafnium silicon oxide (HfSiO, Si>10%),
wherein the ferroelectric layer comprises HfO, doped HfO, hafnium zirconium oxide (HfZrO), or HfSiO (2% <Si<10%), and
wherein a dopant of the doped HfO is zirconium (Zr), lanthanum (La), yttrium (Y), gadolinium (Gd), silicon (Si), aluminum (Al), or a combination thereof.

19. The ferroelectric memory device of claim 16,
wherein the ferroelectric memory device is configured to store data based on a spontaneous polarization characteristic of the ferroelectric layer.

20. The ferroelectric memory device of claim 16, wherein the ferroelectric memory device is capacitorless dynamic random access memory (DRAM).

* * * * *